(12) United States Patent
Xuan et al.

(10) Patent No.: US 8,280,340 B2
(45) Date of Patent: Oct. 2, 2012

(54) CLOCK GENERATION FOR INTEGRATED RADIO FREQUENCY RECEIVERS

(75) Inventors: Peiqi Xuan, Saratoga, CA (US); Yifeng Zhang, San Jose, CA (US); Xuechu Li, Beijing (CN)

(73) Assignee: Quintic Holdings, Santa Clara, CA (US)

( * ) Notice: Subject to any disclaimer, the term of this patent is extended or adjusted under 35 U.S.C. 154(b) by 665 days.

(21) Appl. No.: 12/551,569

(22) Filed: Sep. 1, 2009

(65) Prior Publication Data
US 2011/0053534 A1    Mar. 3, 2011

(51) Int. Cl.
*H04B 1/28* (2006.01)
(52) U.S. Cl. ............ 455/333; 455/240.1; 455/260; 455/334; 375/327; 375/345
(58) Field of Classification Search ............ 455/205, 455/208, 209, 230, 232.1, 234.1, 240.1, 255–260, 455/323, 324, 333, 334; 375/324, 327, 345
See application file for complete search history.

(56) References Cited

U.S. PATENT DOCUMENTS

| | | | | |
|---|---|---|---|---|
| 5,430,890 A * | 7/1995 | Vogt et al. | ............... | 455/180.3 |
| 7,024,171 B2 * | 4/2006 | Gibbs | ............... | 455/260 |
| 7,502,435 B2 * | 3/2009 | Hammes | ............... | 375/376 |
| 8,130,871 B2 * | 3/2012 | May et al. | ............... | 375/316 |
| 8,160,117 B1 * | 4/2012 | Courcy | ............... | 375/130 |

* cited by examiner

*Primary Examiner* — Nhan Le
(74) *Attorney, Agent, or Firm* — Blairtech Solution LLC

(57) ABSTRACT

Systems of clock generation for integrated radio frequency receiver. In an integrated radio frequency receiver, a mixer is often used to down convert the incoming radio frequency signal. The down converted signal is then digitized and digital signal processing circuitry is used for efficient and flexible implementation of various functions to receive the underlying audio and/or data information. The mixer requires clock generation circuitry to provide a proper local oscillator signal for a selected channel. On the other hand, the digital signal processing circuitry requires its separate digital clock for proper operations. The clock generation system utilizes single local oscillator generation circuitry to provide the local oscillator signals required by the mixer and the digital clock signals required by the digital signal processing circuitry. In order to maintain a fixed frequency for the digital clock signal regardless channel selection, a fractional divider coupled with sigma-delta circuitry is used to derive the digital clock signal.

22 Claims, 9 Drawing Sheets

CLOCK GENERATION FOR INTEGRATED RADIO FREQUENCY RECEIVERS

FIELD OF THE INVENTION

The present invention generally relates to radio frequency receivers and particularly to clock generation for integrated radio receivers requiring local oscillator signals for the mixer and digital clock for digital signal processing circuitry.

BACKGROUND

Radio frequency receivers have been widely used in various electronic products such as AM and FM radios, television sets, and GPS (global positioning system) navigation devices. Typically there are multiple channels within the allocated spectrum. In order to receive the signal in a desired channel, the radio frequency input signal is usually mixed with a single-frequency signal generated by a local oscillator (LO) to translate the incoming radio frequency signal to a lower-frequency signal suitable for further processing using cost effect components and/or for superior performance. The frequency translated signal may be a baseband signal, low-IF (intermediate frequency) or IF signal. The low frequency characteristic of the frequency translated signal makes itself ideal for digital signal processing at lower clock speed to conserve power consumption. In addition, the use of digital signal processing technique provides high flexibility for processing the underlying signal. Therefore, the integrated radio receiver usually includes digital signal processing circuitry to perform the required receiving functions such as filtering, demodulation, and de-multiplexing (for FM stereo broadcast).

In order to receive a desired channel, the incoming radio frequency signal is mixed with a selected LO signal to translate the frequency of incoming radio frequency signal to a lower frequency signal. A bandpass or a low pass filter is applied to the mixed signal in order to filter out possible interfering signals. The proper mixer operation requires a desired LO signal to be generated responsive to the channel selection. The LO signal usually is generated by a clock generation circuit which typically includes a voltage controlled oscillator coupled with phase locked loop circuitry. On the other hand, the digital signal processing circuitry also requires clock signals to operate properly. The clock signals for the digital signal processing circuitry should not be change with channel selection. The frequency of clock signals for the digital signal processing (DSP) circuitry may be fixed. However, the frequency of clock signals for the digital signal processing circuitry may be changed according to different requirements such as a lower frequency to consume less power. The clock signals for the digital signal processing circuitry may be generated using a separate clock generation circuit. Nevertheless, for cost saving reason as well as space saving reason, it is preferred that the digital signal processing circuitry can share the same clock generation circuit used by the mixer to generate the LO signals.

A system and method for sharing single clock generation circuitry by the mixer and the digital signal processing circuitry is disclosed in U.S. Pat. No. 7,272,373, entitled "Ratiometric Clock Systems for Integrated Receivers and Associated Methods". In U.S. Pat. No. 7,272,373, the clock generation circuitry generates an oscillation signal that passes through a first divider to generate mixing signals for the mixer. The oscillation signal also passes through a second divider to generate a digital clock signal that is utilized by the DSP circuitry. In U.S. Pat. No. 7,272,373, the frequency of the digital clock signal may be changed when a channel is changed since the oscillation signal is generated according to the selected channel and the digital clock signal is divided down from the oscillation signal by an integer. It is desirable to maintain the frequency of the digital clock signal fixed regardless of the channel selection.

In light of the foregoing discussions, therefore it is desirable to provide systems for clock generation shared by the mixer and the digital signal processing circuitry. Furthermore, it is desirable to maintain the frequency of the digital clock signal fixed regardless of channel selection.

BRIEF SUMMARY OF THE INVENTION

The present invention discloses systems for clock generation shared by the mixer and the digital signal processing circuitry. A voltage controlled oscillator (VCO) coupled with phase locked loop (PLL) circuitry is used to generate a local oscillator (LO) signal. The LO signal is provided to the mixer. The LO signal is also used to derive clock signals for the digital signal processing circuitry. Since the frequency of the LO signal varies according to the channel selection, a fractional divider is used along with a sigma-delta modulator to derive the desired digital clock signals.

In one embodiment, the present invention discloses a clock generation system for an integrated radio frequency receiver, comprising local oscillator (LO) generation circuitry, a first divider, and a second divider. The LO generation circuitry is coupled to receive a channel selection signal as an input and configured to provide a first signal according to the channel selection signal. The first divider is coupled to receive the first signal to provide a second signal utilized to generate mixing signals for a mixer. The second divider is coupled to receive one of the first signal and the second signal, and coupled to sigma-delta modulation circuitry to provide a third signal utilized to generate clock signals used to operate the digital signal processing (DSP) circuitry. Furthermore, the LO generation circuitry, the mixer, the first divider, and the second divider are implemented on an integrated circuit.

In another embodiment of the present invention, an integrated radio frequency receiver is disclosed. The integrated radio frequency receiver comprises a mixer, analog-to-digital conversion circuitry, digital signal processing circuitry, and a clock generation system. The mixer is configured to receive a mixing signal and a radio frequency signal having a plurality of channels to provide a mixed signal. The analog-to-digital converter is coupled to the mixer to receive the mixed signal and to provide a digitized signal. The digital signal processing circuitry is coupled to the analog-to-digital conversion circuitry to receive the digitized signal and is configured to provide a baseband signal output. The digital signal processing circuitry is clocked by a digital clock signal. The clock generation system is configured to receive a channel selection signal and is configured to provide a first signal utilized to generate the mixing signal for the mixer and the digital clock signal to the digital signal processing circuitry. The clock generation system comprises a local oscillator (LO) generation circuitry, a first divider, and a second divider. The local oscillator (LO) generation circuitry is coupled to receive the channel selection signal as an input and configured to provide a local oscillator signal according to the channel selection signal. The first divider coupled to receive the local oscillator signal to provide the first signal. The second divider coupled to receive one of the local oscillator signal and the first signal, wherein the second divider is coupled to sigma-delta modulation circuitry to provide a second signal utilized to generate the digital clock signal. Furthermore, the mixer, the analog-

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 1A-C and FIGS. 2A-F. However, those skilled in the art will readily appreciate that the detailed description given herein with respect to these figures is for explanatory purposes as the invention extends beyond these limited embodiments.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

Figure 1A:
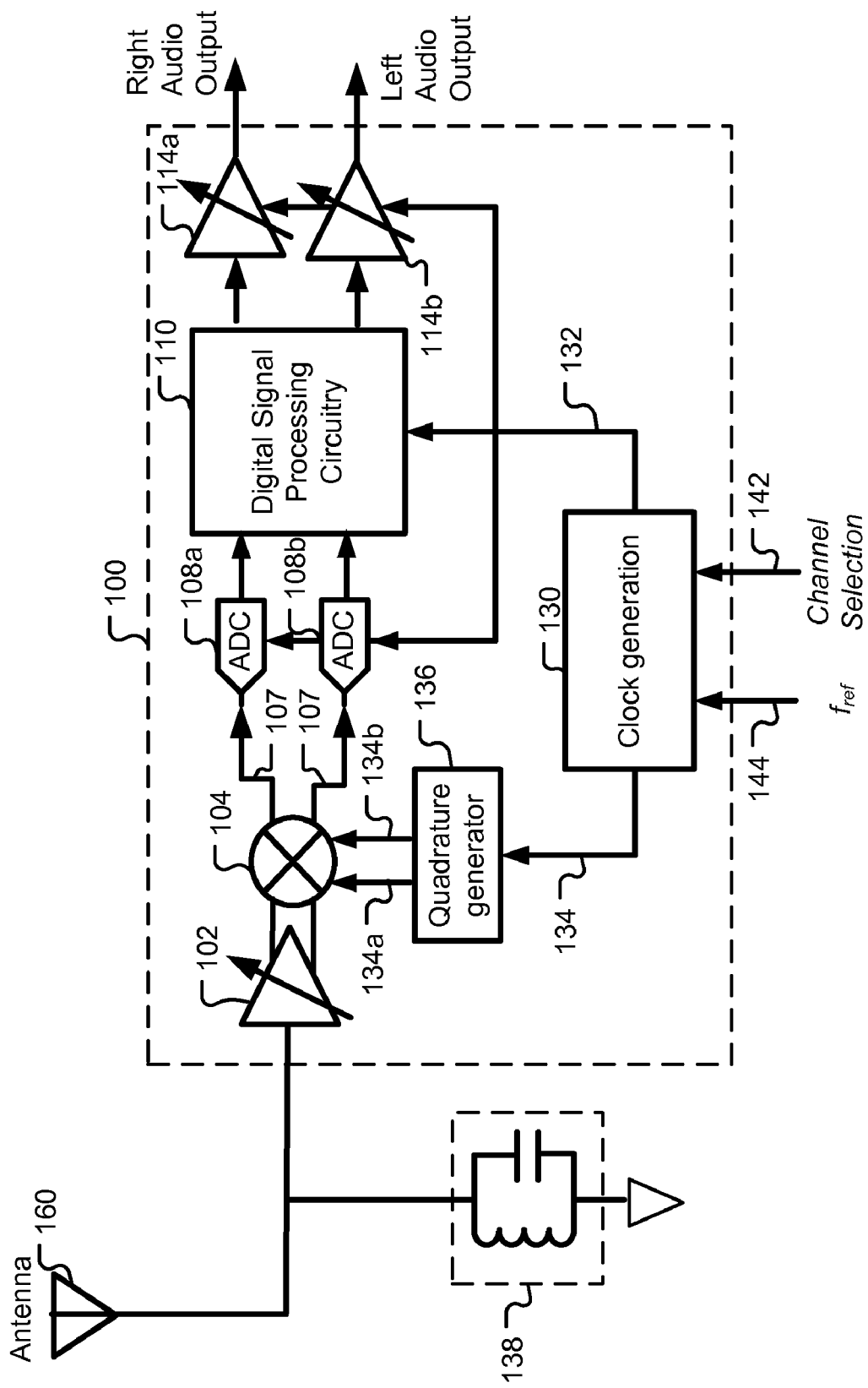
FIG. 1A shows a system block diagram of a radio frequency receiver incorporating a clock generation system of the present invention.

FIG. 1A shows a system embodying the present invention. The system comprises a main receiver unit 100 and a tunable filter 138. An external antenna 160 is coupled to the tunable filter 138 and the main receive unit 100 to receive radio frequency signals. The main receiver unit 100 is coupled to the antenna 160 to receive radio frequency signals. A low noise amplifier (LNA) 102 is used to amplify the signal received from the antenna 160 which is usually a very small signal. While the LNA 102 in FIG. 1A is shown as part of the main receive unit 100, the LNA 102 may be an external device (off chip) in some implementation. The amplified radio frequency signal is then supplied to the mixer 104 to mix with a pair of local oscillator signals 134a and 134b. The quadrature generator 136 generates a pair of signals having the same frequency at difference phases: one is in-phase and the other is 90-degree shifted. While a single mixer 104 is shown in FIG. 1A, it is understood that the mixer is for complex signal consisting of a real part signal and an imaginary part signal. Alternatively, two separate scalar mixers can be drawn in FIG. 1A. The mixer output signal 107 is the frequency translated signal corresponding to a desired signal having a frequency typically being the difference between the frequency of a desired radio frequency signal and the frequency of the LO signal. The mixed signal 107 is also a complex signal having a real part signal and an imaginary part signal. The mixed signal 107 is then converted into digital signals by a pair of analog-to-digital converters (ADC) 108a and 108b. Also, a single ADC may be drawn in some systems and it is understood that the ADC is for a complex signal and consists of two individual ADCs.

Upon the analog to digital conversion, the digitized signals can be conveniently processed by digital signal processing (DSP) circuitry 110. The digital signal processing circuitry 110 may be implemented in digital logics, field programmable gate array (FPGA), digital signal processor, or a combination of digital logics and microcontroller. The digital signal processing circuitry 110 will perform necessary receiving functions to receive the intended signal. For example, in an FM audio receiver, the DSP circuitry 110 will perform digital filtering, FM demodulation, de-emphasis, and stereo de-multiplexing to produce a pair of stereo audio signals. FIG. 1A also shows a pair of digital-to-analog converters and audio buffers, 114a and 114b, which are used to provide amplified analog audio outputs.

The main receive unit 100 also includes clock generation circuitry 130 to supply clocks required to operate various parts of the main receive unit 100. The mixing signals 134a and 134b required by the mixer 104 are supplied by the clock generation circuitry 130 via the quadrature generator 136. The quadrature generator 136 receives the local oscillator signal 134 from the clock generation circuitry 130 and generates an in-phase and a 90-degree phase shifted signals 134a and 134b respectively. The frequency of the local oscillator signal 134 is determined according to the channel selection signal 142. The clock generation circuitry 130 also accepts an external reference clock 144 to generate the local oscillator signal 134 which is phase locked with the reference clock 144. The digital signal processing circuitry 110 requires a clock to operate. The clock frequency required by the digital signal processing circuitry 110 is often referred to as a digital clock 132 and the clock frequency may be different from the local oscillator signal frequency required by the mixer 104. As mentioned earlier, the frequency of the local oscillator signal supplied to the mixer 104 is based on the channel intended to be received. On the other hand, the clock frequency for the digital signal processing circuitry 110 is selected to be fast enough to execute required operations with some margin. The frequency of the digital clock may not have to be tied to the frequency of the local oscillator signal. Furthermore, the digital clock frequency does not have to be changed when the local oscillator signal frequency changes due to channel switch. FIG. 1A also shows that the same digital clock is supplied to the analog-to-digital converters 108a and 108b and the audio output digital-to-analog converters/buffers 114a and 114b. However, the analog-to-digital converters 108a and 108b may use an external supplied clock different from the digital clock for the digital signal processing circuitry 110. Also, the audio digital-to-analog converters/buffers 114a and 114b may use an externally supplied clock different from the digital clock for the digital signal processing circuitry 110. In some receiver implementation, digital circuitry other than the digital signal processing circuitry may exist. For example, Finite State Machine (FSM) circuitry may be used to implement system measurement and control functions such as Received Signal Strength Indicator (RSSI) measuring and tuning control. The FSM circuitry also requires a digital clock to operate and the clock can be supplied by the clock generation circuitry as well.

Figure 1B:
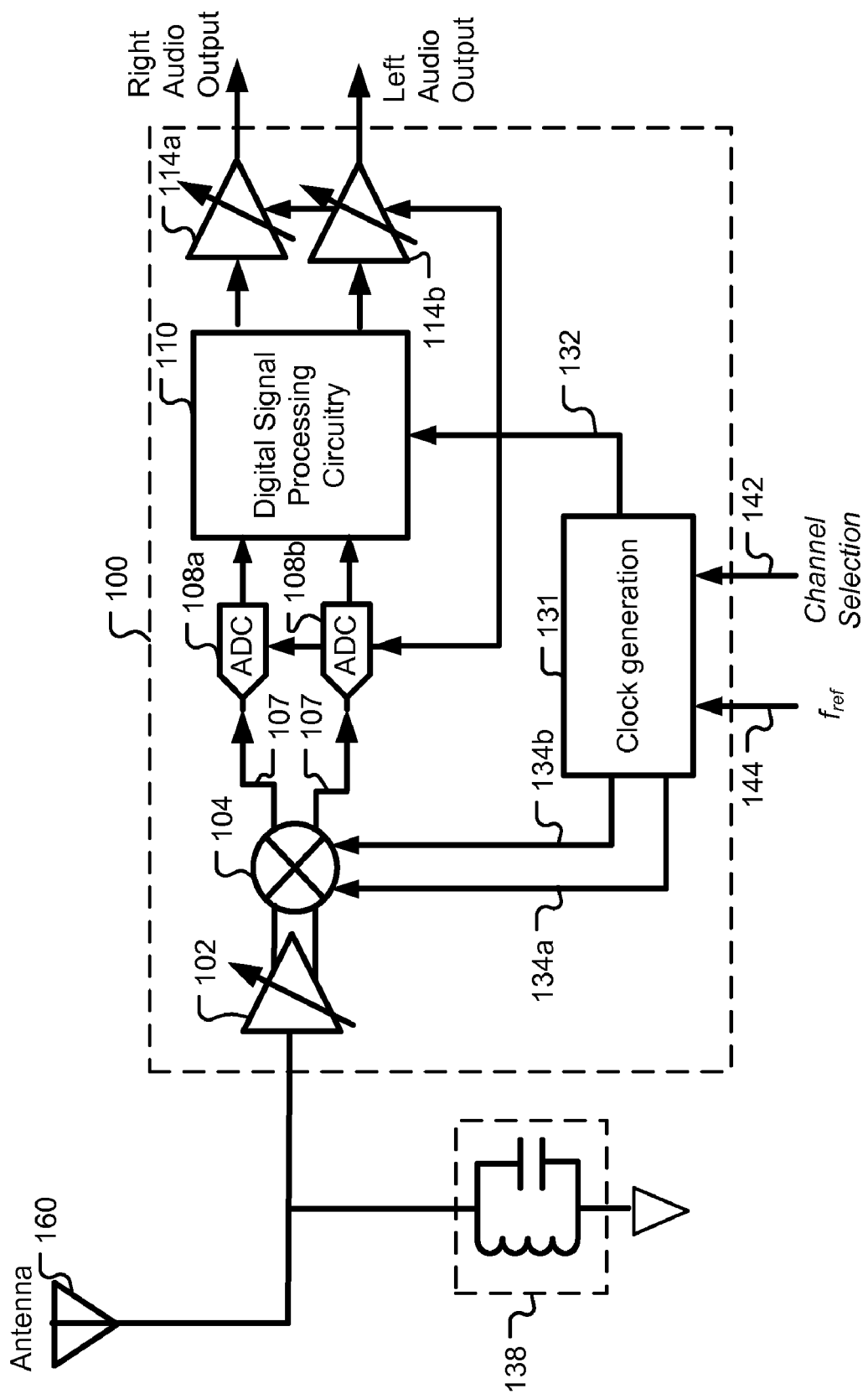
FIG. 1B shows a system block diagram of a radio frequency receiver incorporating an alternative clock generation system of the present invention.

FIG. 1B shows an alternative system embodying the present invention. The system in FIG. 1B is substantially the same as the system in FIG. 1A. The same parts in FIG. 1B are labeled with the same reference numbers as those in FIG. 1A. The main difference between the clock generation circuitry 130 of FIG. 1A and the clock generation circuitry 131 of FIG. 1B is that the quadrature generator 136 of FIG. 1A is incorporated into the clock generation circuitry 131 of FIG. 1B.

Figure 1C:
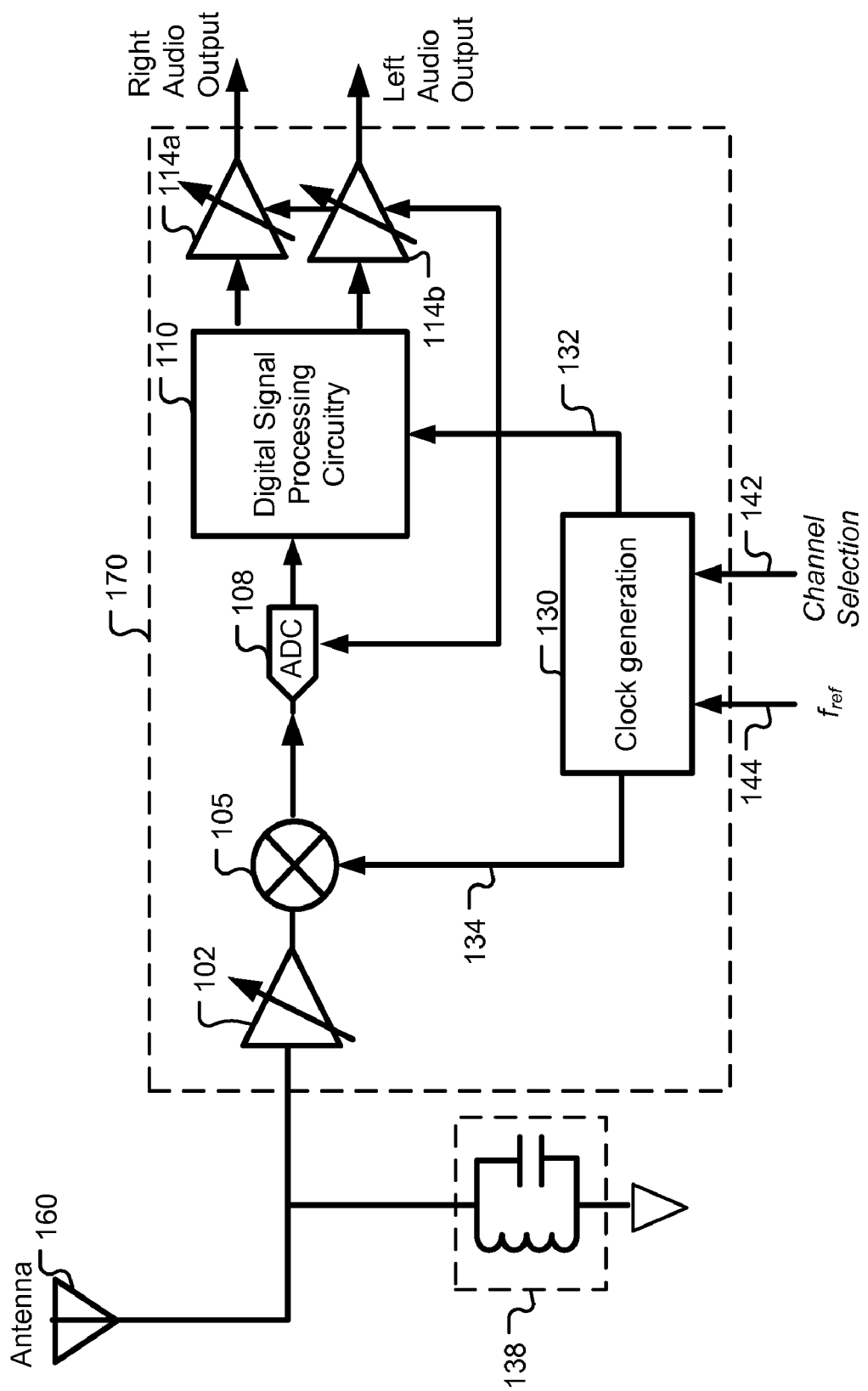
FIG. 1C shows a system block diagram of an alternative radio frequency receiver incorporating an clock generation system of the present invention.

While FIG. 1A and FIG. 1B show two alternative systems embodying the present invention, the invention can also be practiced by arranging the parts differently or by adding/removing system parts. For example, filters can be inserted before or/and after the mixer to filter out undesired signals. The present invention is not limited to the radio frequency receiver having complex mixer/LO and ADC. Some radio frequency receivers, such as AM broadcast receiver, does not require to process received signal in a complex form. Furthermore, even for radio frequency systems utilizing quadrature modulation, a single scalar mixer/LO and ADC can still be used and the quadrature processing can be performed by the digital signal processing circuitry. FIG. 1C shows system with a main receive unit 170 which has a single scalar mixer 105 and a single ADC 108. The mixing signal 134 is provided to the mixer 105 by the clock generation circuitry 130. The mixed signal output may be an intermediate frequency (IF) signal. For an AM broadcast receiver, there will be a single audio output instead of a pair of audio outputs as shown in FIG. 1C.

Figure 2A:
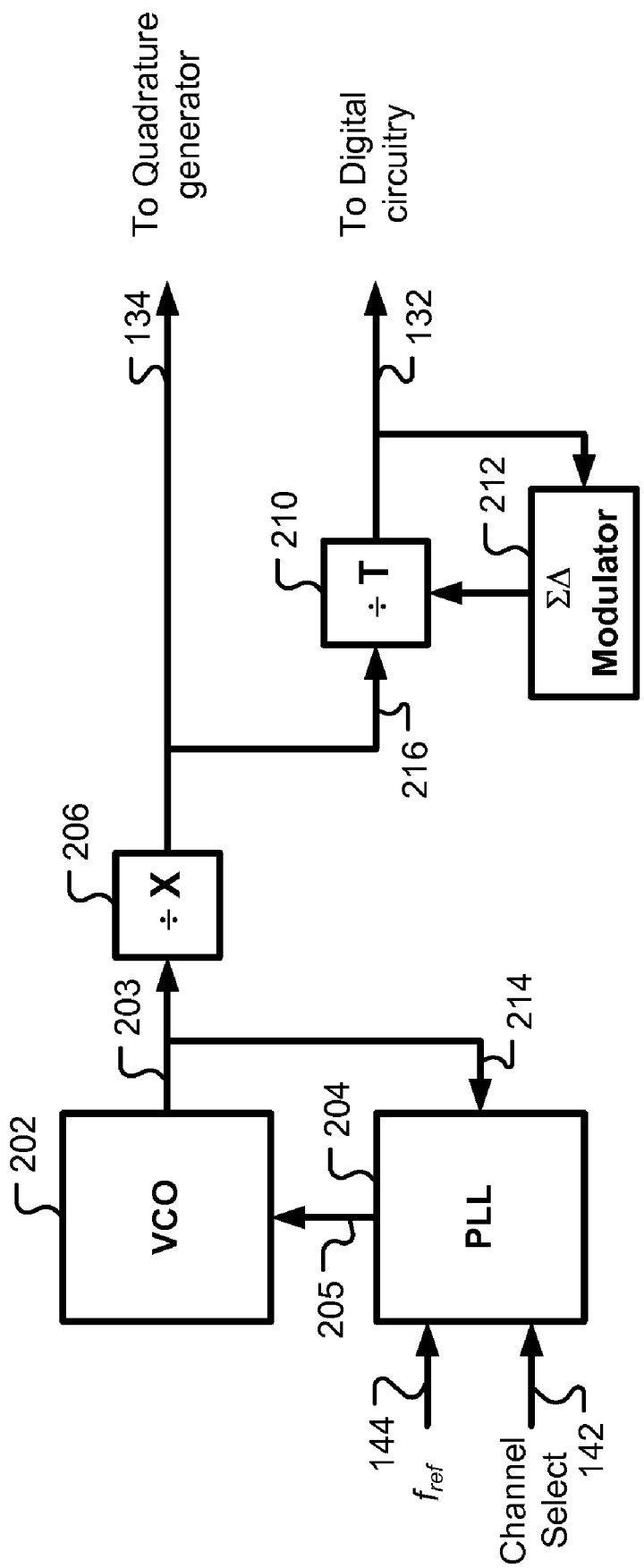
FIG. 2A shows one implementation of the clock generation system of the present invention.

FIG. 2A shows one implementation of the clock generation circuitry 130. The clock generation circuitry comprises a voltage controlled oscillator (VCO) 202 coupled with a phase locked loop (PLL) circuit 204. The PLL circuit 204 includes the reference clock input 144, the channel selection input 142, and a feedback input 214. The feedback signal 214 is taken from the VCO output 203 as shown in FIG. 2A. Nevertheless, the feedback signal 214 may also be taken from other parts of the clock generation circuitry. For example, instead of taking the feedback signal from the VCO output 203, the feedback signal may also be taken from the output of the divider 206. The PLL circuit 204 generates a control signal 205 to adjust frequency of the VCO 202. The clock generation circuitry further comprises a divider 206 to divide down the frequency of VCO output signal. The signal divided down by the divider 206 can be supplied to the quadrature generator 136. A fractional divider 210 coupled with a sigma-delta modulator 212 is used to generate the required digital clock. The input 216 for the fractional divider 210 uses the signal output from divider 206 as shown in FIG. 2A. However, the input to the fractional divider 210 may also be taken from other parts of the clock generation circuitry 130. For example, the fractional divider 210 may also take input from the VCO output 203. The frequency of the output signal from the divider 206 varies according the channel selection signal 142. However, the fractional divider 210 has enough resolution to generate a fraction number resulting in a desired digital clock based on any given signal output from divider 206. The sigma-delta modulator 212 used in the configuration can alleviate the noise associated with the fractional divider 210 by noise shaping.

Figure 2B:
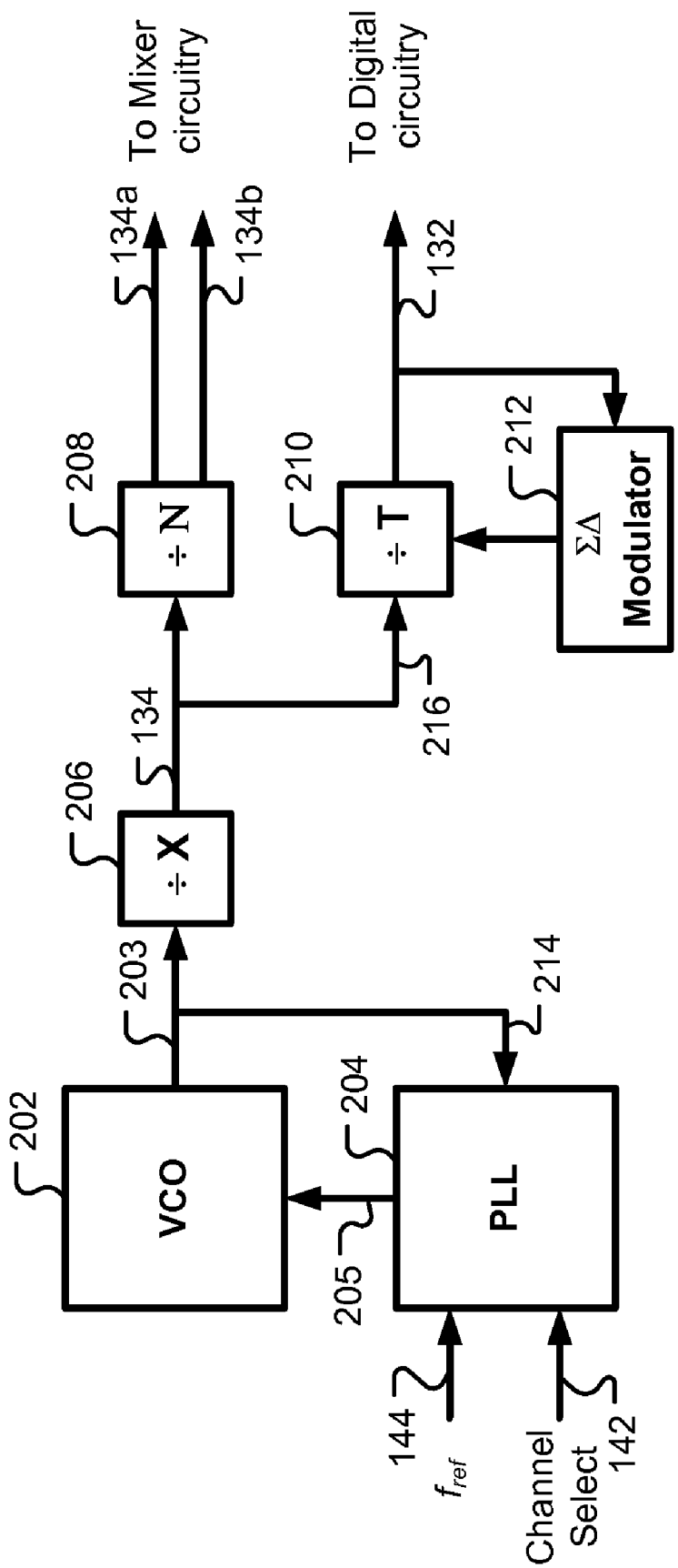
FIG. 2B shows an alternative implementation of the clock generation system of the present invention.

FIG. 2B shows one implementation of the clock generation circuitry 131. The system in FIG. 2B is substantially the same as the system in FIG. 2A. The same parts in FIG. 2B are labeled with the same reference numbers as those in FIG. 2A. The difference between the clock generation circuitry of FIG. 2A and the clock generation circuitry of FIG. 2B is the additional quadrature generator with a divide-by-N divider 208 of FIG. 2B. The value of N is an integer, typically a small integer such as 2, 3 or 4, where the example of 2, 3 or 4 mentioned here is for illustration instead of limitation of the present invention.

Figure 2C:
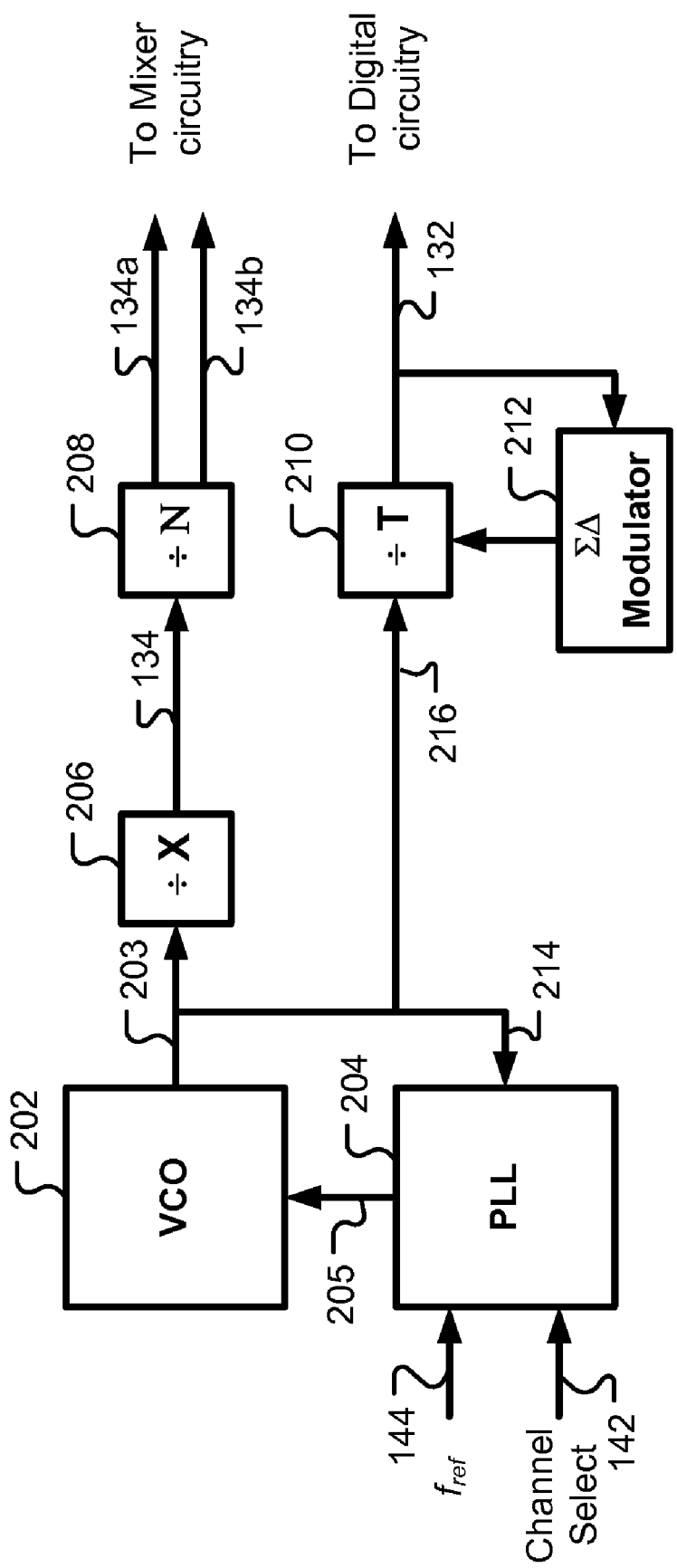
FIG. 2C shows an alternative implementation of the clock generation system of the present invention.
Figure 2D:
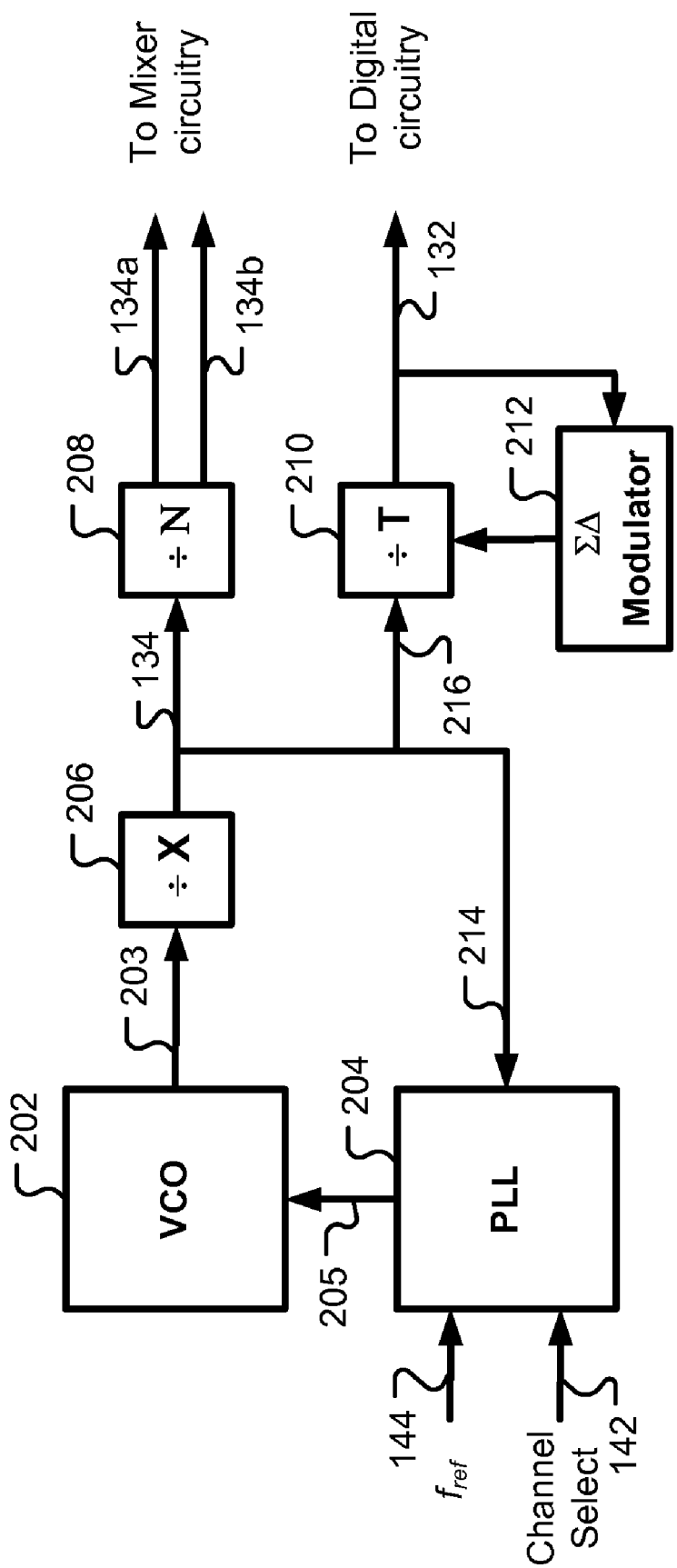
FIG. 2D shows an alternative implementation of the clock generation system of the present invention.
Figure 2E:
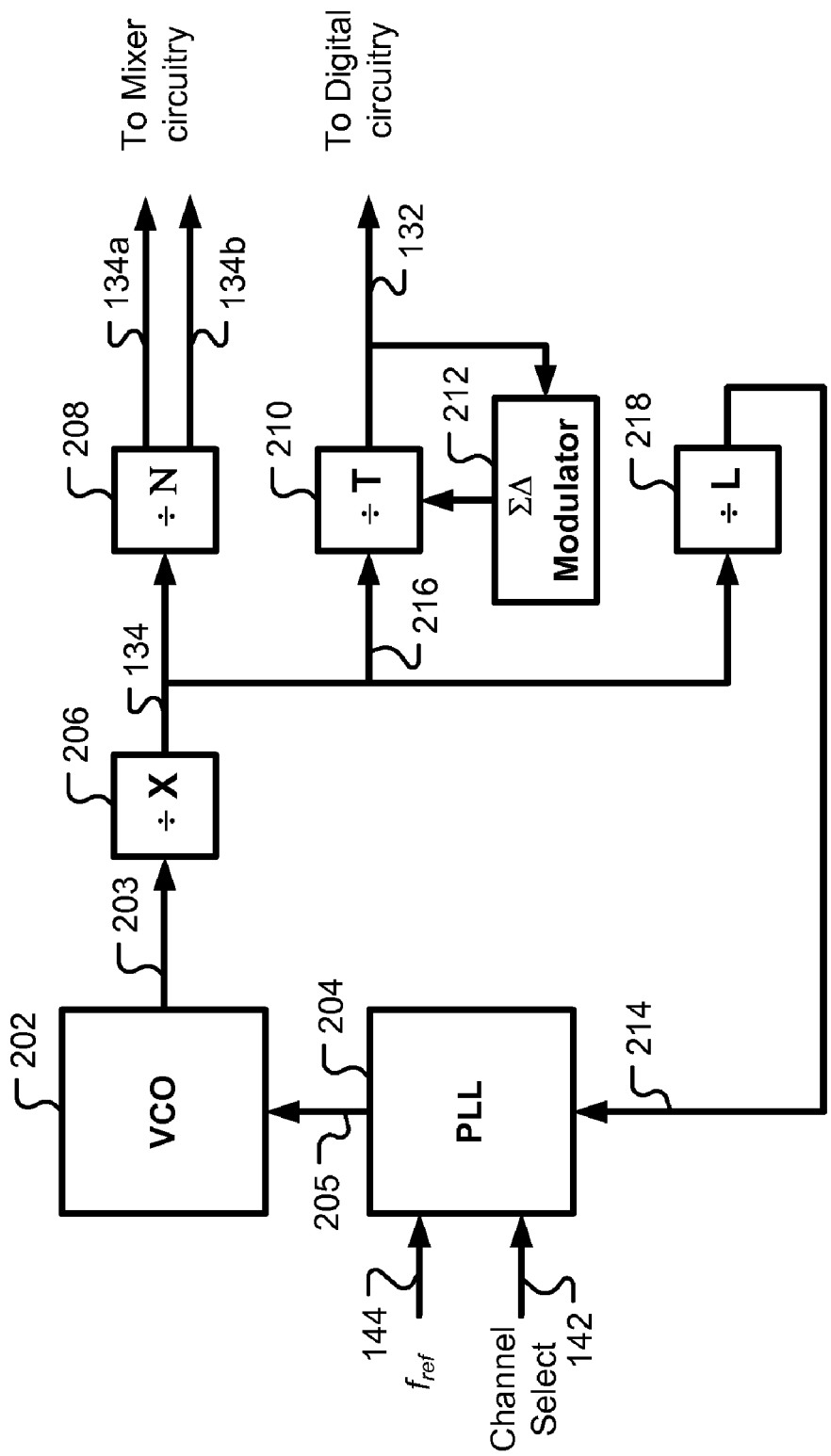
FIG. 2E shows an alternative implementation of the clock generation system of the present invention.
Figure 2F:
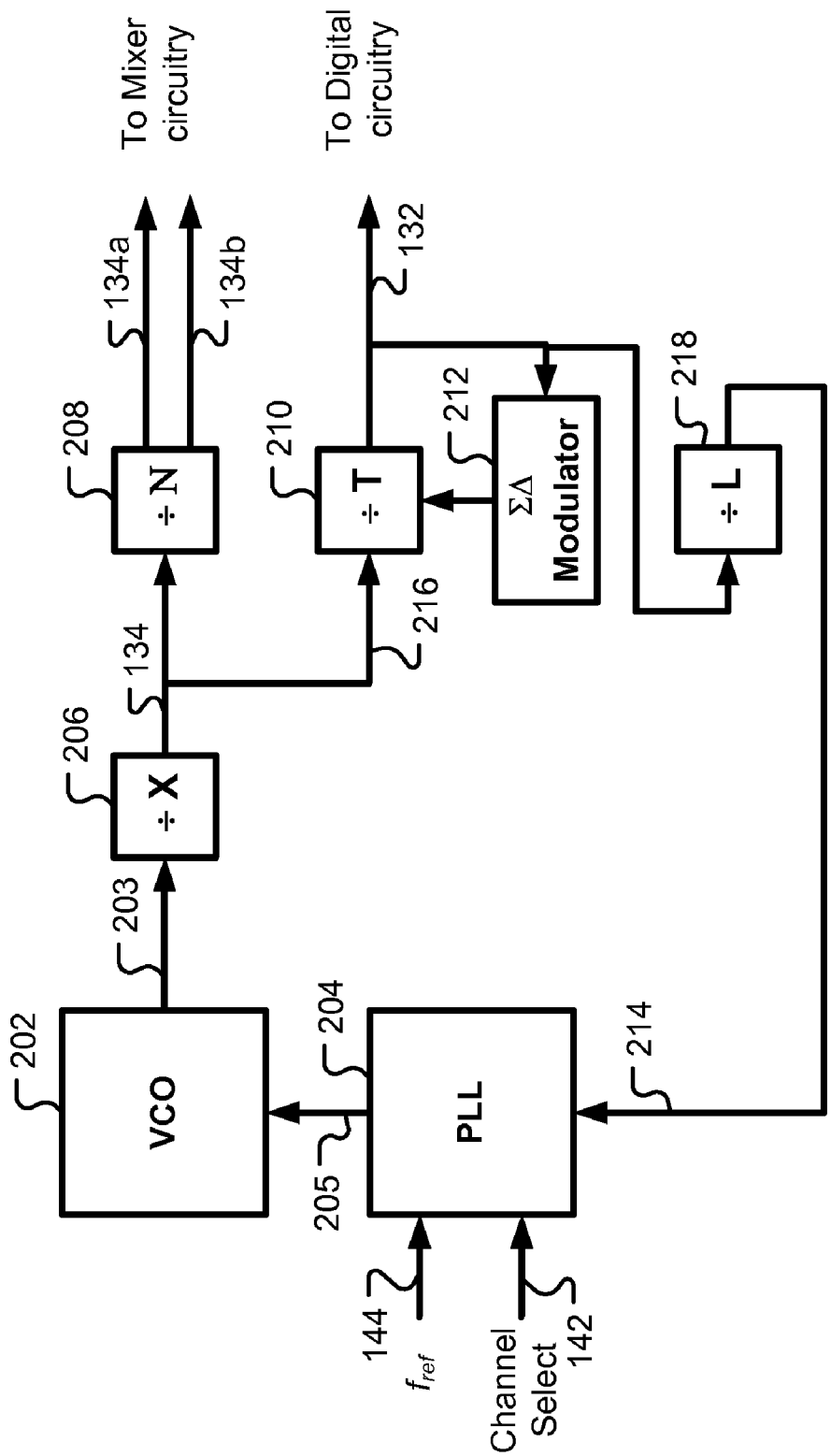
FIG. 2F shows an alternative implementation of the clock generation system of the present invention.

FIG. 2C shows another implementation of the clock generation circuitry 131. In FIG. 2C, the input for the fractional divider 210 is taken from the output of VCO 203 instead of the output of divider 206. FIG. 2D shows yet another implementation of the clock generation circuitry 131. In FIG. 2D, the input for the fractional divider 210 and the feedback signal for the PLL 204 are taken from the output of divider 206. FIG. 2E shows an alternative implementation of the clock generation circuitry 131. In FIG. 2E, a dedicated divider 218 is used to provide the feedback signal for the PLL 204. The divider 218 receives its input from the divider 206 output. FIG. 2F shows another alternative implementation of the clock generation circuitry 131. The implementation of FIG. 2F is almost the same as that of FIG. 2E except that the input to the divider 218 is taken from the output of divider 210 instead of the output of divider 206.

An exemplary case is provided for the clock generation circuitry shown in FIG. 2F. The reference clock, $f_{ref}$=32.768 kHz is used and the channel selection is chosen to cause the VCO output a clock signal at 2 GHz (signal 203). The desired mixing signals (134a and 134b) for the mixer are 100 MHz. In order to divide down the VCO output from 2 GHz to 100 MHz, the divider 206 is set to 5 (i.e., X=5) and the divider 208 is set to 4 (i.e., N=4). The desired digital clock is chosen to be 20.48 MHz. In order to generate this frequency, the divider 210 is set to 19.53125 (i.e., T=19.53125) and the 20.48 MHz clock can be precisely divided down from 2 GHz. In order to provide a feedback signal to the PLL circuitry, a 32.768 kHz signal has to be derived from a signal coupled to the VCO output. Based on the configuration of FIG. 2F, the feedback signal is divided down from the digital clock, 20.48 MHz. By setting the divider 218 to 625 (i.e., L=625), a feedback signal at 32.768 kHz can be obtained. When the desired channel is changed, the VCO will output a different frequency according to the channel selection. The fractional divider 210 will be set to a different value to maintain the 20.48 MHz digital clock. The divider 218 stays the same to generate the desired 32.768 kHz feedback signal.

The above detailed description illustrates the specific embodiments of the present invention and is not intended to be limiting. Numerous modifications and variations within the scope of the invention are possible. The present invention is set forth in the following claims.

What is claimed is:

1. A clock generation system for an integrated radio frequency receiver, comprising:

local oscillator (LO) generation circuitry coupled to receive a channel selection signal as an input and configured to provide a first signal according to the channel selection signal;

a first divider coupled to receive the first signal to provide a second signal utilized to generate mixing signals for a mixer; and a second divider coupled to receive one of the first signal and the second signal, and coupled to sigma-delta modulation circuitry to provide a third signal utilized to generate clock signals used to operate digital signal processing (DSP) circuitry;

wherein the LO generation circuitry, the mixer, the first divider, and the second divider are implemented on an integrated circuit.

2. The clock generation system of claim 1, wherein the first divider includes support for integer frequency division.

3. The clock generation system of claim 1, wherein the second divider includes support for fractional frequency division.

4. The clock generation system of claim 1, further comprising quadrature generator circuitry coupled to the first divider to receive the second signal and to provide the mixing signals to the mixer.

5. The clock generation system of claim 4, further comprising a third divider wherein the third divider includes support for integer frequency division.

6. The clock generation system of claim 1, further comprising voltage controlled oscillator circuitry coupled to phase locked loop circuitry, wherein the phase locked loop circuitry includes a reference clock input and a feedback signal input, and wherein the first signal maintains fixed phase relation with the reference clock.

7. The clock generation system of claim 6, wherein the feedback signal is coupled from the first signal.

8. The clock generation system of claim 6, wherein the feedback signal is coupled from the second signal.

9. The clock generation system of claim 6, further comprising a third divider coupled to one of the first signal and the second signal to provide the feedback signal.

10. The clock generation system of claim 6, further comprising a third divider coupled to the third signal to provide the feedback signal.

11. The clock generation system of claim 1, wherein the third signal is utilized to generate clock signals used to operate analog-to-digital conversion circuitry integrated with the integrated circuit.

12. An integrated radio frequency receiver, comprising:
a mixer configured to receive a mixing signal and a radio frequency signal having a plurality of channels and to provide a mixed signal;
analog-to-digital conversion circuitry coupled to the mixer to receive the mixed signal and to provide a digitized signal;
digital signal processing circuitry coupled to the analog-to-digital conversion circuitry to receive the digitized signal and to provide a baseband signal output, wherein the digital signal processing circuitry is operated by a digital clock signal;
a clock generation system configured to receive a channel selection signal and to provide a first signal utilized to generate the mixing signal for the mixer and the digital clock signal for the digital signal processing circuitry, wherein the clock generation system comprising:
local oscillator (LO) generation circuitry coupled to receive the channel selection signal as an input and configured to provide a local oscillator signal according to the channel selection signal,
a first divider coupled to receive the local oscillator signal and configured to provide the first signal, and
a second divider coupled to receive one of the local oscillator signal and the first signal, and coupled to sigma-delta modulation circuitry to provide a second signal utilized to generate the digital clock signal;
wherein the mixer, the analog-to-digital conversion circuitry, the digital signal processing circuitry and the clock generation system are implemented on an integrated circuit.

13. The integrated radio frequency receiver of claim 12, wherein the first divider includes support for integer frequency division.

14. The integrated radio frequency receiver of claim 12, wherein the second divider includes support for fractional frequency division.

15. The integrated radio frequency receiver of claim 12, further comprising quadrature generator circuitry coupled to the first divider to receive the first signal and configured to provide a pair of quadrature signals to the mixer.

16. The integrated radio frequency receiver of claim 15, further comprising a third divider, wherein the third divider includes support for integer frequency division.

17. The integrated radio frequency receiver of claim 12, further comprising voltage controlled oscillator circuitry coupled to phase locked loop circuitry, wherein the phase locked loop circuitry includes a reference clock input and a feedback signal input, and wherein the local oscillator signal maintains fixed phase relation with the reference clock.

18. The integrated radio frequency receiver of claim 17, wherein the feedback signal is coupled from the local oscillator signal.

19. The integrated radio frequency receiver of claim 17, wherein the feedback signal is coupled from the first signal.

20. The integrated radio frequency receiver of claim 17, further comprising a third divider coupled to one of the local oscillator signal and the first signal and configured to provide the feedback signal.

21. The integrated radio frequency receiver of claim 17, further comprising a third divider coupled to the second signal and configured to provide the feedback signal.

22. The integrated radio frequency receiver of claim 12, wherein the second signal is utilized to generate clock signals used to clock analog-to-digital conversion circuitry integrated with the integrated circuit.

* * * * *